United States Patent [19]

Collins et al.

[11] Patent Number: 4,662,063
[45] Date of Patent: May 5, 1987

[54] GENERATION OF OHMIC CONTACTS ON INDIUM PHOSPHIDE

[75] Inventors: David A. Collins, San Diego, Calif.; Derek L. Lile, Ft. Collins, Colo.

[73] Assignee: The United States of America as represented by the Department of the Navy, Washington, D.C.

[21] Appl. No.: 823,176

[22] Filed: Jan. 28, 1986

[51] Int. Cl.$^4$ .............................................. H01L 21/18
[52] U.S. Cl. ........................................ 29/584; 29/586; 148/183; 148/DIG. 119; 228/123
[58] Field of Search ......................... 29/584, 586, 585; 148/183, DIG. 119; 357/61; 228/123

[56] References Cited

U.S. PATENT DOCUMENTS

| | | | |
|---|---|---|---|
| 2,697,269 | 12/1954 | Fuller | 29/584 |
| 2,854,362 | 9/1958 | Brand et al. | 29/586 |
| 2,926,418 | 3/1960 | Zuleeg | 29/586 |
| 2,932,878 | 4/1960 | Jacobs | 29/586 |
| 3,172,188 | 3/1965 | Wood | 29/587 |
| 3,206,340 | 9/1965 | Stelmak | 29/586 |
| 3,339,272 | 9/1967 | MacIver et al. | 357/61 |
| 3,576,549 | 4/1971 | Hess | 29/586 |
| 3,684,930 | 8/1972 | Collins et al. | 357/61 |
| 3,733,690 | 5/1973 | Rizzi et al. | 29/577 |
| 3,940,847 | 3/1976 | Park et al. | 357/61 |
| 4,025,944 | 5/1977 | Moon | 357/67 |
| 4,195,308 | 3/1980 | Hawrylo | 357/67 |
| 4,523,212 | 6/1985 | Hawrylo | 357/17 |

OTHER PUBLICATIONS

Sharma, Semiconductors and Semimetals, V. 15, Academic Press, Inc. (1981), pp. 1-39.
Lindau et al., "Electronic Properties of Metal/III-V Semiconductor Interfaces", Surf. Sci. (Netherlands), V. 162, (Oct. 1985), pp. 591-604.
Piotronska et al., "Ohmic Contacts to III-V Compound Semiconductors . . . ", Solid State Electronics, V. 26, No. 3, pp. 179-197, 1983.

Primary Examiner—Olik Chaudhuri
Attorney, Agent, or Firm—Robert F. Beers; Ervin F. Johnston; Harvey Fendelman

[57] ABSTRACT

A process for forming low resistance ohmic contacts on indium phosphide (InP) avoids the usual problem of high temperature annealing. The method comprises passing a current between two contacts of a suitably chosen metallic conductor that is doped so as to be the same conductivity type as the underlining semiconductor. Passage of the current causes the contacts to combine with the semiconductor via field assisted thermal diffusion.

11 Claims, 7 Drawing Figures

GENERATION OF OHMIC CONTACTS ON INDIUM PHOSPHIDE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates generally to the field of semiconductor devices and, more particularly, to the field of forming low resistance ohmic contacts on indium phosphide (InP).

Low resistance ohmic contacts are a required integral part of many solid state devices and circuits. However, semiconductors are often difficult to contact in this way. Ohmic contacts are of critical importance to modern electronic components and circuits. Indium phosphide in particular is a highly promising semiconductor for future high speed electronics. P-type indium phosphide is an example of a material for which many attempts using a variety of metal combinations and annealing cycles have been used in the past to achieve suitably low resistance contacts. Particularly with compound semiconductors, annealing at other than quite low temperatures is generally considered undesirable due to the possible loss of the more volatile component during the thermal exposure, and thus severe restrictions are placed upon useable annealing cycles.

SUMMARY OF THE INVENTION

The technique of the present invention eliminates to a large extent the above described thermal exposure by restricting the time of heating of the indium phosphide semiconductor to five seconds or less. Further, the technique of forming ohmic contacts on indium phosphide as disclosed herein can be expected to directly impact the future implementation of indium phosphide electronic devices due to the availability of a convenient and reliable technique for forming good contacts on this material.

In accordance with the technique of the present invention, the forming of an ohmic contact relies on both the use of heating as well as a high electric field. Specifically, two dots or islands of a suitable contact metal such as a two percent mixture of zinc in indium used with a semiconductor that is p-type indium phosphide, are placed on the indium phosphide semiconductor to be contacted. A voltage is applied across the contact metal dots so that a large field exists in the high resistance contact region. As a result of this field, a current flows resulting in localized resistive heating and melting of the contacts. As soon as this occurs, the voltage is removed and the sample is allowed to cool. Typically, times less than five seconds are adequate to accomplish this cycle.

As is described in further detail below, the technique of the present invention has been found to lead to significant reductions in contact resistance values. The present method has the advantage that it is quick to implement and that it limits the sample heating largely to the contact area itself. In addition, the temperatures achieved, which are in the neighborhood of 300° C., for less than five seconds, are less than usually employed in conventional contacting processes both in magnitude and duration. As a result of utilizing the process of the present invention, therefore, thermally induced sample degradation is minimized. In addition, if a curve tracer is utilized to generate the current applied to the sample, then it is actually possible to monitor the improvement in contact resistance in real time from the current versus voltage CRT display.

OBJECTS OF THE INVENTION

Accordingly, it is the primary object of the present invention to disclose a novel technique for forming low resistance ohmic contacts on indium phosphide.

It is a further object of the present invention to disclose a process for forming ohmic contacts on semiconductors while minimizing thermal exposure of the semiconductor.

It is a concomitant object of the present invention to disclose a process for forming low resistance ohmic contacts on semiconductors in which thermally induced sample degradation is minimized.

These and other objects of the invention will become more readily apparent from the ensuing specification when taken together with the drawings.

DESCRIPTION OF THE PREFERRED EMBODIMENT

Figure 1:
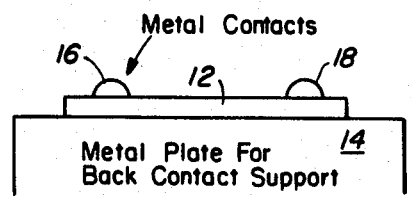
FIG. 1 is a schematic side view of a semiconductor sample that has had metal contact regions applied to it.

Beginning now with FIG. 1, the process of the present invention will be described by way of example. In FIG. 1 there is illustrated a semiconductor layer such as a layer of p-type indium phosphide 12. The indium phosphide layer 12 may be supported by a metallic plate 14 for back contact support. While FIG. 1 illustrates a layer of p-type indium phosphide, it is to be understood that the layer 12 may also represent n-type indium phosphide. Suitable metallic regions (dots) 16 and 18 are applied to the surface of the semiconductor layer 12 by well known techniques such as by utilization of a soldering iron. The metal chosen for the metallic regions 16 and 18 contains an appropriate dopant such as zinc (Zn) which is a p-type impurity in indium phosphide and which would be expected to create a p+ region under the metal regions 16 and 18. The metal contact regions 16 and 18 may be formed from any suitable metal such as indium. Where the semiconductor layer 12 is n-type indium phosphide the metal contact regions 16 and 18 may comprise indium metal without further dopant since the indium itself will act as an n-type impurity in the underlying n-type layer 12 of indium phosphide. The concentration of the dopant used in the metal contact regions 16 and 18 is not a critical parameter in the process. The dopant can be dissolved in the metal by heating, for example, prior to forming the dots 16 and 18. A low melting point metal such as In is to be preferred so as to simplify this mixing and the application of the dots to the layer 12.

Figure 2:
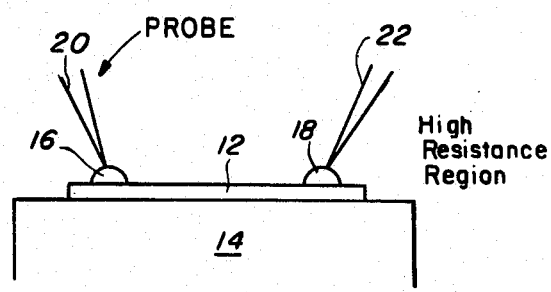
FIG. 2 is a schematic side view of the sample illustrated in FIG. 1 with electrical probes applied to the contact regions.

Referring to FIG. 2, electric probes 20 and 22 are next applied to the dots 16 and 18 as illustrated and an a.c., non-arcing current is passed between them sufficient in amplitude and time to form p+ regions beneath the metal contact regions 16 and 18. The exact details of the current-time cycle may vary and depend to a large extent on the geometric details of the metal contacts and the semiconductor sample. It is important that no arcing occur between the probes 20 and 22 and the dots 16 and 18 since any arcing would severely damage the surface of the semiconductor 12.

Figure 3:
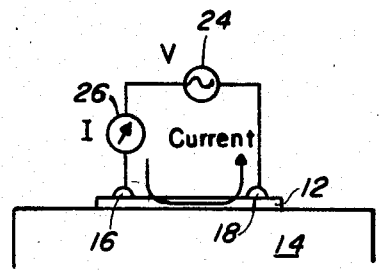
FIG. 3 is a schematic side view of the sample illustrated in FIGS. 1 and 2 and showing the circuitry used to generate and measure the current flow between the contact regions.
Figure 4:
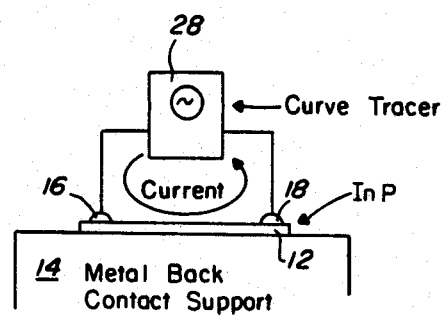
FIG. 4 is a schematic side view of an alternate arrangement for performing the process of the present invention.

To apply the current and monitor the progress of the ohmic contact formation, a variety of circuit configurations can be utilized. Basically, what is needed is a variable current/voltage supply such as a.c. current/voltage supply 24 illustrated in FIG. 3 and a current and voltage measurement device such as meter 26 illustrated in FIG. 3 wherein the meter 26 and the source 24 are illustrated as connected in series and across the contact regions 16 and 18. As an alternate embodiment, as is illustrated in FIG. 4, a curve tracer 28 may be utilized by connecting it across the metallic contact region 16 and 18 as illustrated in FIG. 4. The curve tracer 28 provides all the functions required, i.e. a current/voltage applied for a certain time that is manually determined in a visual CRT display of current versus voltage. As a further alternate embodiment, a d.c. source may be utilized. With a d.c. source, the source would be connected with the positive terminal connected to dot 16 and with the negative terminal connected to dot 18. With this connection, one of the dots 16 or 18 would be made ohmic by using the technique of the present invention. The d.c. source polarity would then be reversed and the process applied to make the other dot ohmic.

Figure 6:
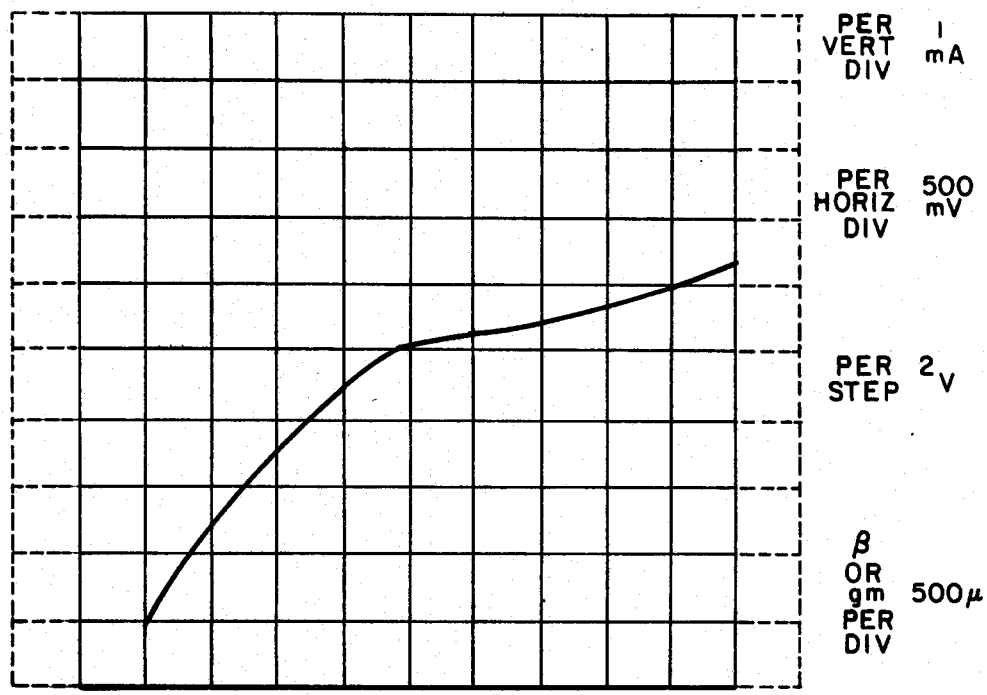
FIG. 6 is a graphical representation of the current versus voltage relationship for a sample semiconductor having two Zn/In contacts before the field enhanced annealing treatment of the present invention.
Figure 7:
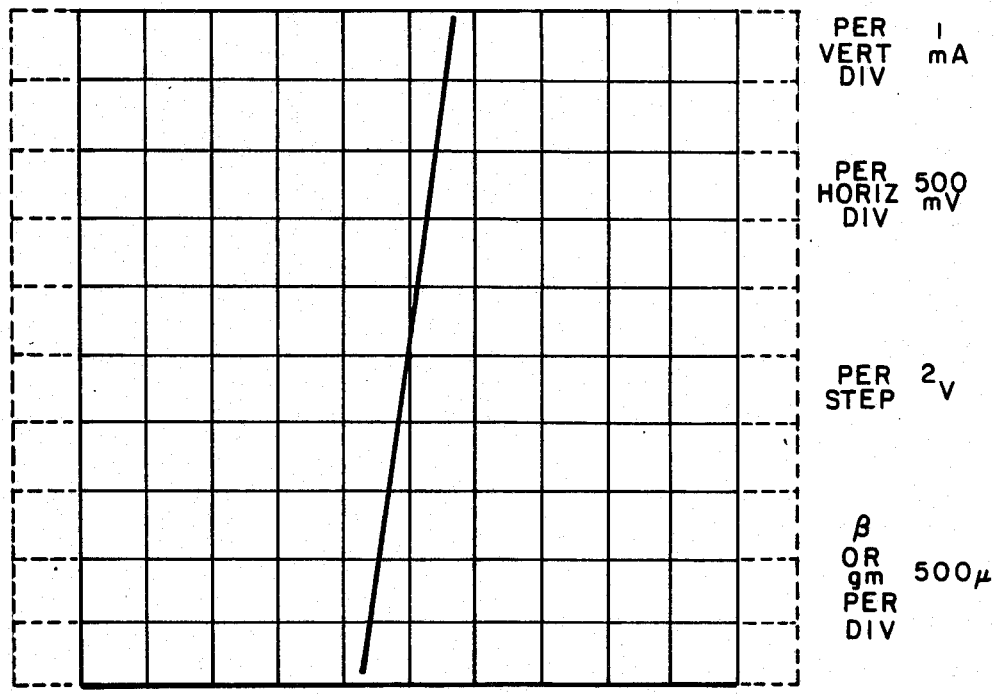
FIG. 7 is a graphic representation of the current versus voltage relationship for the same sample to which FIG. 6 relates after the field enhanced annealing treatment of the present invention.

In one specific example, a two percent mixture of Zn in In was used to form the dots or metallic contact regions 16 and 18 on a semiconductor layer of p-type indium phosphide. The current generating set up illustrated in FIG. 4 was utilized and the probes 20 and 22 were contacted to the contact regions 16 and 18. Thus, a voltage was applied across the contact regions 16 and 18 so that a large field existed in the high resistance contact region. As a result of this field, a current was observed to flow between the contact regions 16 and 18 resulting in localized resistive heating and melting of the contacts 16 and 18. As soon as this occurred, the voltage was removed and the sample was allowed to cool. Typically, times less than five seconds are adequate to accomplish this cycle. As is illustrated in FIGS. 6 and 7, wherein the current/voltage display of the curve tracer 28 is illustrated respectively, before and after the field enhanced annealing treatment of the present invention was applied, utilization of the procedure of the present invention on p-type indium phosphide has been found to lead to significant reductions in contact resistance values. Whereas specific annealing conditions using the present invention will depend on the details of the structure to which the process is applied, as an example, it has been found that a current of approximately 500 ma peak applied in three or four sequential cycles of approximately one second duration each has given the best results. To accomplish this, the curve tracer 28 may be set on the ten watt limited range with the display set at the 50 or 100 ma/division and set at the ten volts/division level.

Figure 5:
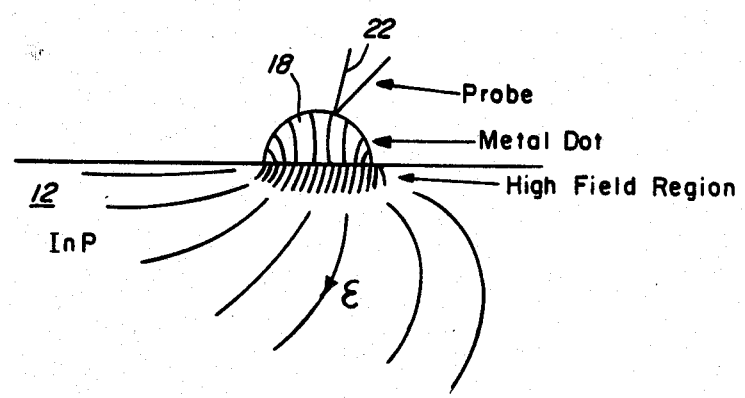
FIG. 5 is a schematic side view of one of the metal contact regions illustrating the electric field distribution for the initial condition of a high contact resistance.

It is believed that the process of the present invention involves both a thermal diffusion of the contact metal into the semiconductor due to resistive heating thereby leading to p+ doping and an enhanced contact, and that in addition, the electric field concentrated automatically in the high resistance contact region, leads to field assisted mass transport. The field distribution is shown schematically in FIG. 5 for the initial condition of a high contact resistance, by way of example with respect to contact region 18. The high field $\epsilon$ in the high resistance region can cause a field assisted diffusion of the dopant from the metal into the semiconductor. Such field driven mass transport is well known as electromigration in device degradation studies and is caused by the electrostatic force of the field on the charged dopant atoms tending to move them in the direction of (or opposite to) the field.

Obviously, many modifications and variations of the present invention are possible in the light of the above teachings. It is therefore to be understood that within the scope of the appended claims the invention may be practiced otherwise than as specifically described.

We claim:

1. A method of forming low resistance ohmic contacts on indium phosphide comprising the steps of:
    forming first and second regions of contact metal on the surface of said indium phosphide;
    passing a non-arcing electric current through and between said regions of contact metal for a sufficiently long time and at a sufficiently high current amplitude so as to form p+ regions in said indium phosphide in the regions beneath said regions of metal.

2. The method of claim 1 wherein said indium phosphide and said contact metal are doped and wherein said contact metal and said indium phosphide are doped with the same conductivity type material.

3. The method of claim 2 wherein said contact metal is doped with p-type dopant and said indium phosphide is doped with p-type dopant.

4. The method of claim 3 wherein said contact metal p-type dopant is zinc.

5. The method of claim 1 wherein said first and second regions of contact metal are formed on the surface of said indium phosphide by utilizing a soldering iron to apply said contact metal to said surface.

6. The method of claim 1 wherein said electric current is alternating current.

7. The method of claim 1 wherein said electric current is direct current.

8. The method of claim 1 wherein said current is passed through and between said regions of contact metal for a period of time on the order of 5 seconds.

9. The method of claim 7 wherein said current has an amplitude on the order of 500 ma.

10. The method of claim 1 wherein said current is passed so as to cause localized melting of said contact metal without melting said indium phosphide.

11. The method of claim 8 wherein:
    said current is d.c. current and has an amplitude on the order of 500 ma and is applied in approximately three sequential cycles of approximately one second duration each.

* * * * *